(12) United States Patent
Yao et al.

(10) Patent No.: US 7,351,994 B2
(45) Date of Patent: Apr. 1, 2008

(54) NOBLE HIGH-K DEVICE

(75) Inventors: Liang-Gi Yao, Hsin-Chu (TW);
Tien-Chih Chang, Taipei (TW);
Ming-Fang Wang, Taichung (TW);
Shih-Chang Chen, Hsin-Chu (TW);
Mong-Song Liang, Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 340 days.

(21) Appl. No.: 10/762,164

(22) Filed: Jan. 21, 2004

(65) Prior Publication Data

US 2005/0156255 A1    Jul. 21, 2005

(51) Int. Cl.
*H01L 29/06* (2006.01)
*H01L 21/336* (2006.01)

(52) U.S. Cl. .......................... 257/18; 257/19; 257/20; 257/190; 257/288; 257/E29.193; 438/197

(58) Field of Classification Search ............... 257/213, 257/190, 347, 365, 192, 217, 285, 288, 410, 257/413, 900, 368, 369
See application file for complete search history.

(56) References Cited

U.S. PATENT DOCUMENTS

| | | | |
|---|---|---|---|
| 5,357,119 A | 10/1994 | Wang et al. ................... 257/18 |
| 6,271,094 B1 | 8/2001 | Boyd et al. ................... 438/287 |
| 6,287,903 B1 | 9/2001 | Okuno et al. ................. 438/197 |
| 6,310,367 B1 | 10/2001 | Yagishita et al. ............. 257/190 |
| 6,335,238 B1 | 1/2002 | Hanttangady et al. ....... 438/240 |
| 6,350,993 B1 * | 2/2002 | Chu et al. ....................... 257/19 |
| 6,353,249 B1 | 3/2002 | Boyd et al. ................... 257/369 |
| 6,407,406 B1 | 6/2002 | Tezuka |
| 6,603,156 B2 * | 8/2003 | Rim ............................. 257/190 |
| 6,784,101 B1 * | 8/2004 | Yu et al. ....................... 438/666 |
| 6,805,962 B2 * | 10/2004 | Bedell et al. ................ 428/446 |
| 7,084,431 B2 * | 8/2006 | Chu et al. ....................... 257/79 |
| 7,217,603 B2 * | 5/2007 | Currie et al. ................ 438/149 |
| 2002/0125497 A1 * | 9/2002 | Fitzgerald .................... 257/191 |
| 2005/0132952 A1 * | 6/2005 | Ward et al. .................... 117/89 |
| 2006/0057749 A1 * | 3/2006 | Dwilinski et al. ............ 438/22 |
| 2006/0197126 A1 * | 9/2006 | Lochtefeld et al. ......... 257/288 |

* cited by examiner

*Primary Examiner*—Alonzo Chambliss
(74) *Attorney, Agent, or Firm*—Haynes Boone, LLP

(57) ABSTRACT

At least one high-k device, and a method for forming the at least one high-k device, comprising the following. A structure having a strained substrate formed thereover. The strained substrate comprising at least an uppermost strained-Si epi layer. At least one dielectric gate oxide portion over the strained substrate. The at least one dielectric gate oxide portion having a dielectric constant of greater than about 4.0. A device over each of the at least one dielectric gate oxide portion to complete the least one high-k device. A method of forming the at least one high-k device.

21 Claims, 2 Drawing Sheets

NOBLE HIGH-K DEVICE

FIELD OF THE INVENTION

The present invention relates generally to semiconductor fabrication and more specifically to formation of devices incorporating high-k dielectric gate oxide layers.

BACKGROUND OF THE INVENTION

High-k dielectric materials have been investigated to replace conventional gate oxide layers due to excellent current-leakage reduction seen when using the high-k dielectric materials at the same equivalent-oxide-thickness (EOT). However, high-k dielectric materials also suffer poor mobility and high threshold voltage issues in the electric performance of devices.

U.S. Pat. No. 6,310,367 B1 to Yagishita et al. describes a strained Si and high-k gate dielectric Tx process wherein the concentration of Ge in the channel layer of the NMOSFET is lower that the concentration of Ge in the channel layer of the PMOSFET. The gate electrodes of the NMOSFET and the PMOSFET are made of metallic materials.

U.S. Pat. No. 5,357,119 to Wang et al. describes an SiGe and gate oxide process.

U.S. Pat. No. 6,353,249 B1 to Boyd et al. describes an SiGe substrate and high-k gate dielectric.

U.S. Pat. No. 6,271,094 B1 to Chooi et al. and U.S. Pat. No. 6,335,238 B1 to Hanttangady et al. are related SiGe substrate and high-k dielectric Tx patents.

U.S. Pat. No. 6,287,903 B1 to Okuno et al. describes a structure and method for a large-permittivity dielectric using a germanium layer.

SUMMARY OF THE INVENTION

Accordingly, it is an object of one or more embodiments of the present invention to provide improved substrate/high-k dielectric gate oxide material structures and methods of forming same.

Other objects will appear hereinafter.

It has now been discovered that the above and other objects of the present invention may be accomplished in the following manner. Specifically, a structure having a strained substrate formed thereover is provided. The strained substrate comprising at least an uppermost strained-Si epi layer. At least one dielectric gate oxide portion over the strained substrate. The at least one dielectric gate oxide portion having a dielectric constant of greater than about 4.0. The at least one dielectric gate oxide portion being comprised of $HfO_2$, $HfSiO_4$, N-doped hafnium silicate (N-doped $HfSiO_x$), $ZrO_2$ or $ZrSiO_x$. A device over each of the at least one dielectric gate oxide portion to complete the least one high-k device. The invention also includes a method of forming the at least one high-k device.

BRIEF DESCRIPTION OF THE DRAWINGS

The present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENT

For the purposes of this invention, all strained-Si epi layers/substrates have a dislocation density of strained-Si epi of less than about $1E6/cm^2$ and a high-k dielectric material has a dielectric constant (k) of greater than about 4.0.

Figure 1:
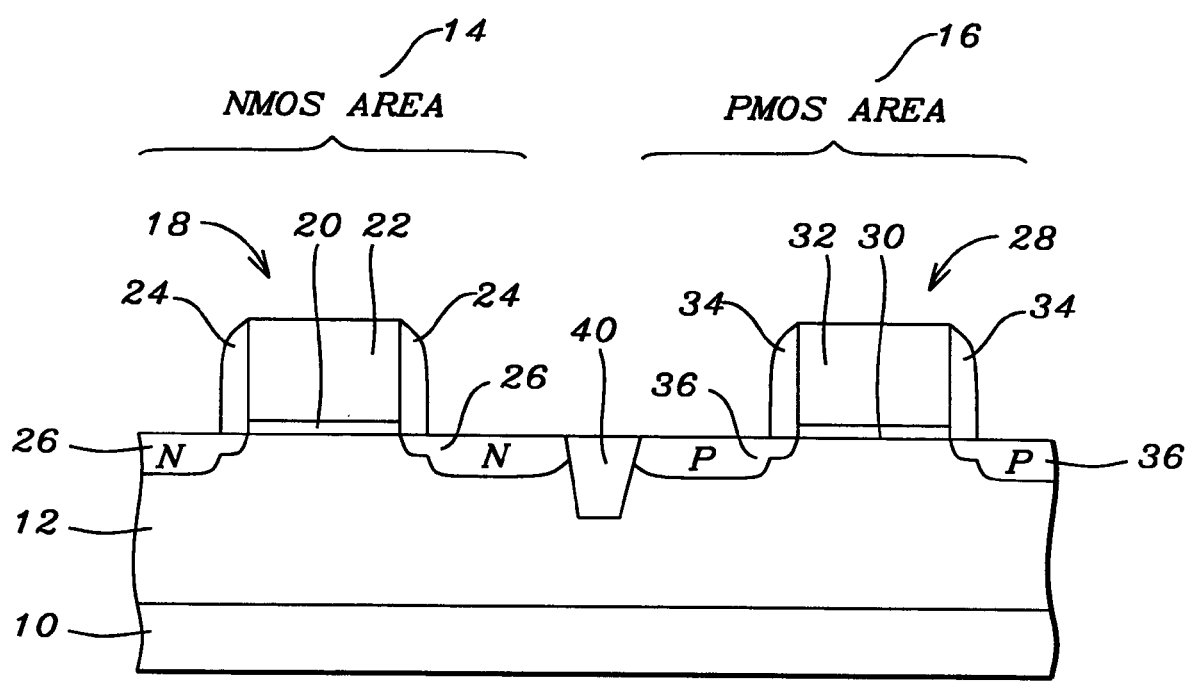
FIG. 1 schematically illustrate a preferred embodiment of the present invention employing a first preferred embodiment strained-Si substrate.

Strained-Si Epi Layer 12—FIG. 1 (First Embodiment)

As shown in FIG. 1, the preferred structure of the present embodiment includes a semiconductor structure 10 having a strained substrate 12 formed thereover to a thickness of preferably from about 3000 to 100,000 Å and more preferably from about 4000 to 50,000 Å.

In the first embodiment, strained substrate 12 is comprised of entirely of strained-silicon epitaxial (strained-Si epi). As noted above, strained-Si epi substrate 12 has a dislocation density of strained-Si epi of less than about $1E6/cm^2$.

Structure 10 is preferably a silicon substrate or a germanium substrate, is more preferably a silicon substrate and is understood to possibly include a semiconductor wafer or substrate.

Structure 10 may include: one or more NMOS areas 14 within which one or more NMOSFETs 18 (N-type metal-oxide semiconductor field effect transistors) are formed; and may include one or more PMOS areas 16 within which one or more PMOSFETs 28 (P-type metal-oxide semiconductor field effect transistors) are formed. It is noted that a single, unitary strained-Si epi substrate layer 12 is formed under the NMOSFET's 18 and PMOSFET's 28 as this allows for enhanced mobility for both NMOS and PMOS devices 18, 28 and allows for a simpler process in forming the underlying strained substrate layer 12.

NMOSFET 18 and PMOSFET 28 each include respective high-k dielectric gate oxide portions 20, 30 that each have a thickness of preferably from about 10 to 200 Å and more preferably from about 10 to 100 Å. The respective high-k dielectric gate oxide portions 20, 30 each are preferably comprised of $HfO_2$, $HfSiO_4$, N-doped hafnium, $HfSiO_x$, $ZrO_2$, $ZrSiO_x$ or N-doped zirconium silicate (N-doped $ZrSiO_x$) and more preferably $HfO_2$ and $HfSiO_4$. It is noted that respective high-k dielectric gate oxide portions 20, 30 are not formed of $Ta_2O_5$, $TiO_2$ or $Al_2O_3$ as they have been found to have poor mobility, difficult process control and poor thermal stability. As noted above, high-k dielectric gate oxide portions 20, 30 have a dielectric constant (k) of greater than about 4.0.

Respective high-k dielectric gate oxide portions 20, 30 may be formed by depositing a layer of high-k dielectric gate oxide and then patterning it.

The high-k dielectric gate oxide portions 20, 30 have respective gate electrode portions 22, 32 having a thickness of preferably from about 500 to 2000 Å and more preferably from about 700 to 1500 Å and being preferably formed of polysilicon (poly Si), TaN, $WSi_x$ or tungsten (W) and more preferably polysilicon (poly Si) which is compatible with the current technology. It is noted that gate electrode portions 22, 32 are not metal gates, for example not TiN metal gates which, although having a lower work function, is hard to control even when employing dummy gates and has difficult integration issues.

Respective sidewall spacers 24, 34 are formed over NMOS and PMOS gate electrode portions 22, 32 to a maximum thickness of preferably from about 200 to 800 Å and more preferably from about 250 to 600.

Respective source/drains 26, 36 are also formed adjacent NMOS and PMOS gate electrode portions 22, 32 within strained-Si epi substrate 12 to a maximum depth of preferably from about 300 to 1500 Å and more preferably from about 400 to 1200 Å.

As shown in FIG. 1, an isolation structure 40 may be formed within strained-Si epi substrate 12/structure 10 between NMOS/PMOS devices 18, 28 to electrically isolate them from each other for example. Isolation structure 40 may be a shallow trench isolation (STI) structure, for example.

It is noted that only NMOS devices 18, only PMOS devices 28 or other devices or a combination thereof may be formed over structure 10 and strained-Si epi substrate 12.

Figure 2:
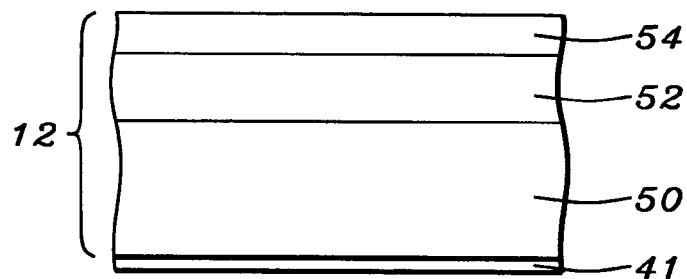
FIG. 2 schematically illustrates a second preferred embodiment of the strained-Si substrate of the present invention.

Strained-Si Epi Layer 54/Relaxed $Si_{1-x}Ge_x$ Layer 52/Graded $Si_{1-y}Ge_y$ Layer Substrate 12—FIG. 2 (Second Embodiment)

As shown in FIG. 2 and in the second embodiment, strained substrate 12 is comprised of an upper strained-Si epi layer 54 over a relaxed $Si_{1-x}Ge_x$ layer 52 (where x is greater than 0 and less than about 0.50) which is in turn over a graded $Si_{1-y}Ge_y$ layer 50 (where y is 0 or about 0 proximate the interface between graded $Si_{1-y}Ge_y$ layer 50 which is in turn over a seed layer 41 and structure 10 and gradually increases (therefore graded) to about X at the interface between graded $Si_{1-y}Ge_y$ layer 50 and relaxed $Si_{1-x}Ge_x$ layer 52).

Upper strained-Si epi layer 54 has a thickness of preferably from about 100 to 500 Å, more preferably from about 150 to 400 Å and most preferably from about 200 to 300 Å. Relaxed $Si_{1-x}Ge_x$ layer 52 has a thickness of preferably from about 1000 to 50,000 Å. Graded $Si_{1-y}Ge_y$ layer 50 has a thickness of preferably from about 2000 to 50,000 Å. Seed layer 41 has a thickness of preferably from about 10 to 200 nm.

As noted above, strained-Si epi layer 54 has a dislocation density of strained-Si epi of less than about $1E6/cm^2$.

Figure 3:
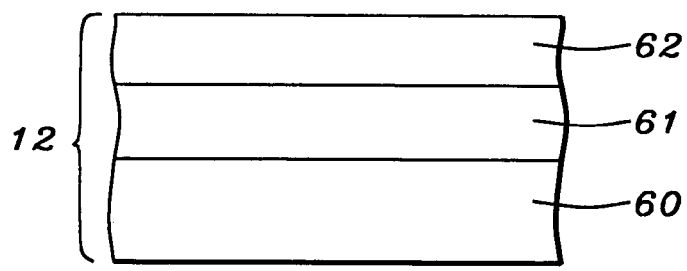
FIG. 3 schematically illustrates a third preferred embodiment of the strained-Si substrate of the present invention.

Strained-Si Epi Layer 62/$SiO_2$ Layer 60 (SOI Layer 12)—FIG. 3 (Third Embodiment)

As shown in FIG. 3 and in the third embodiment, strained substrate 12 is comprised of an upper strained-Si epi layer 62 over a $Si_{1-x}Ge_x$ layer 61 which in turn is over a silicon oxide ($SiO_2$) layer 60 thus forming a silicon-on-insulator (SOI). Upper strained-Si epi layer 62 is bonded to $SiO_2$ layer 60.

Strained-Si epi layer 62 has a thickness of preferably from about 100 to 500 Å, more preferably from about 150 to 400 Å and most preferably from about 200 to 300 Å. $Si_{1-x}Ge_x$ layer 61 has a thickness of preferably from about 700 to 1200 Å. $SiO_2$ layer 60 has a thickness of preferably from about 800 to 2000 Å.

As noted above, strained-Si epi layer 62 has a dislocation density of strained-Si epi of less than about $1E6/cm^2$.

Figure 4:
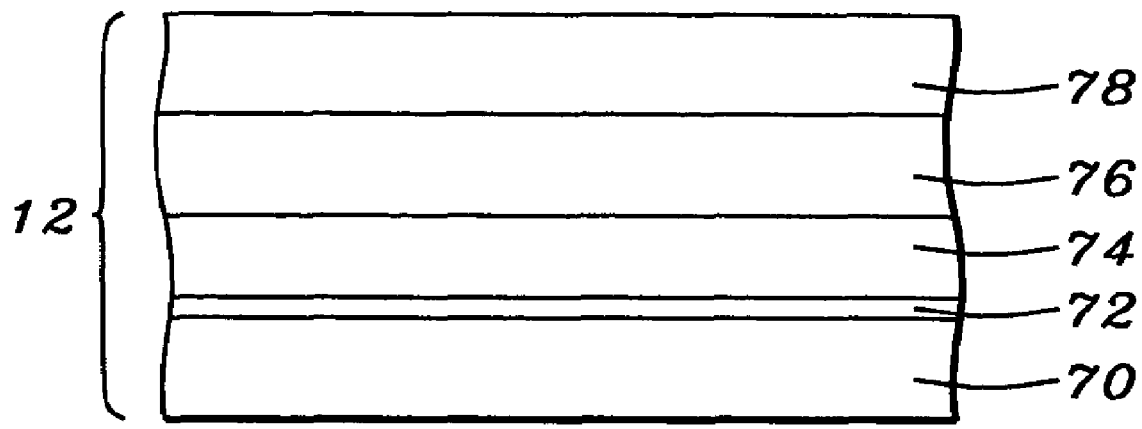
FIG. 4 schematically illustrates a fourth preferred embodiment of the strained-Si substrate of the present invention.

Strained-Si Epi Layer 78/Upper Relaxed $Si_{1-x}Ge_x$ Layer 76/Graded $Si_{1-y}Ge_y$ Layer 74/Thin Epi Layer 72/Lower Relaxed $Si_{1-z}Ge_z$ Layer 70—FIG. 4 (Fourth Embodiment)

As shown in FIG. 4 and in the fourth embodiment, strained substrate 12 is comprised of an upper strained-Si epi layer 78 over an upper relaxed $Si_{1-x}Ge_x$ layer 76 (where x is greater than 0 and less than about 0.50 which is in turn over a graded $Si_{1-y}Ge_y$ layer 74 (where y is about z proximate the interface between graded $Si_{1-y}Ge_y$ layer 74 and epi layer 72 and gradually increases (therefore graded) to about x at the interface between graded $Si_{1-y}Ge_y$ layer 74 and upper relaxed $Si_{1-x}Ge_x$ layer 77) which is in turn over a thin epi silicon layer 72 which is in turn over a lower relaxed $Si_{1-z}Ge_z$ layer 70 (where z is greater than 0 and less than about y where $x \geq y \geq z$.

Upper strained-Si epi layer 78 has a thickness of preferably from about 100 to 500 Å, more preferably from about 150 to 400 Å and most preferably from about 200 to 300 Å. Upper relaxed $Si_{1-x}Ge_x$ layer 76 has a thickness of preferably from about 1000 to 50,000 Å and more preferably from about 2000 to 40,000 Å. Graded $Si_{1-y}Ge_y$ layer 74 has a thickness of preferably from about 200 to 50,000 Å and more preferably from about 500 to 25,000 Å. Thin epi silicon layer 72 has a thickness of preferably from about 20 to 500 Å and more preferably from about 50 to 200 Å. Lower relaxed $Si_{1-z}Ge_z$ layer 70 has a thickness of preferably from about 200 to 50,000 Å and more preferably from about 500 to 25,000 Å.

As noted above, strained-Si epi layer 78 has a dislocation density of strained-Si epi of less than about $1E6/cm^2$.

Figure 5:
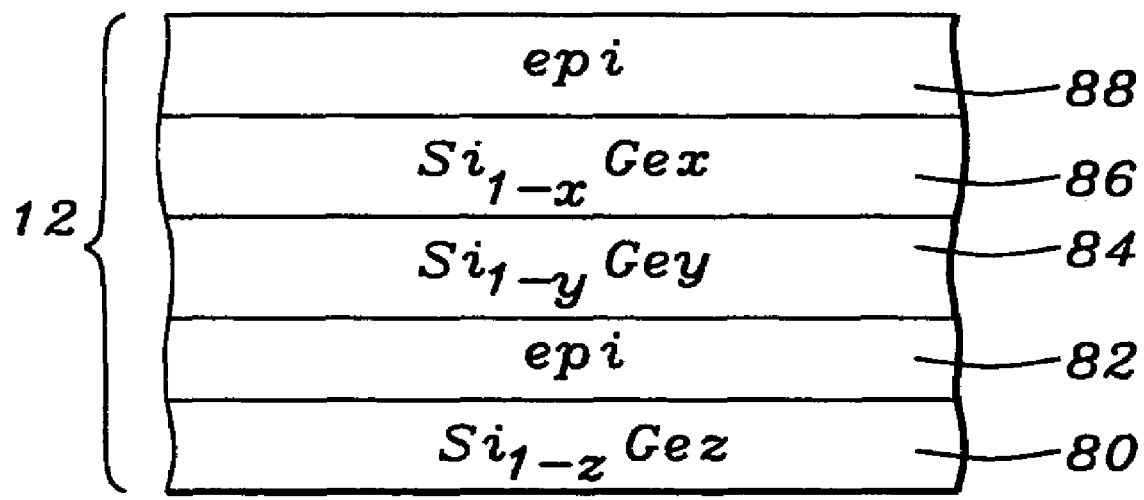
FIG. 5 schematically illustrates a fifth preferred embodiment of the strained-Si substrate of the present invention.

Upper Strained-Si epi layer 88/Relaxed-$Si_{1-x}Ge_x$ Layer 86/Constant $Si_{1-y}Ge_y$ Layer 84/Si Epi Layer 82/Constant $Si_{1-z}Ge_z$ Layer 80—FIG. 5 (Fifth Embodiment)

As shown in FIG. 5 and in the fifth embodiment, strained substrate 12 is comprised of an upper strained-Si epi layer 88 over an upper relaxed epi $Si_{1-x}Ge_x$ layer 86 (where x may be constant or graded) over constant (i.e. non-graded with a constant Ge concentration $Si_{1-y}Ge_y$ layer 84 which is in turn over Si epi layer 82 which is in turn over constant $Si_{1-z}Ge_z$ layer 80 (i.e. non-graded with a constant Ge concentration); where $x \geq y \geq z$.

Upper strained-epi Si layer 88 has a thickness of preferably from about 20 to 500 Å and more preferably from about 50 to 300 Å. Upper relaxed $Si_{1-x}Ge_x$ layer 86 (constant or graded) has a thickness of preferably from about 200 to 30,000 Å and more preferably from about 300 to 5000 Å. Constant $Si_{1-y}Ge_y$ layer 84 has a thickness of preferably from about 200 to 20,000 Å and more preferably from about 300 to 5000 Å. Si Epi Layer 82 has a thickness of preferably from about 20 to 500 Å and more preferably from about 50 to 300 Å. Constant $Si_{1-z}Ge_z$ layer 80 has a thickness of preferably from about 200 to 20,000 Å and more preferably from about 300 to 5000 Å.

Layers 80, 82, 84, 88 are strained layers.

NMOSFET(s) 18, PMOSFET(s) 28 and other devices formed over the high-k dielectric gate oxide portions 20, 30/strained substrate 12 may also be referred to as high-k devices as they incorporate high-k dielectric gate oxide portions.

Advantages of the Present Invention

The advantages of one or more embodiments of the present invention include:
1. higher mobility of high-k devices is achieved; and
3. reduced threshold voltage of high-k devices is achieved.

While particular embodiments of the present invention have been illustrated and described, it is not intended to limit the invention, except as defined by the following claims.

We claim:

1. At least one high-k device, comprising:
   a structure having a strained substrate formed thereover, the strained substrate comprising an uppermost strained-Si epi layer, a middle relaxed $Si_{1-x}Ge_x$ layer and a lowermost graded $Si_{1-y}Ge_y$ layer, the uppermost strained-Si epi layer being disposed directly on the middle relaxed $Si_{1-x}Ge_x$ layer;
   at least one dielectric gate oxide portion over the strained substrate, the at least one dielectric gate oxide portion having a dielectric constant of greater than about 4.0; and
   a device over each of the at least one dielectric gate oxide portion to complete the at least one high-k device.

2. The device of claim 1, the uppermost strained-Si epi layer having a thickness of from about 100 to 500 Å; the middle relaxed $Si_{1-x}Ge_x$ layer having a thickness of from about 1000 to 50,000 Å; and the lowermost graded $Si_{1-y}Ge_y$ layer having a thickness of from about 200 to 50,000 Å.

3. The device of claim 1, where x is greater than 0 and less than about 0.50 and where y is 0 or about 0 proximate the structure and increases to about x proximate the middle relaxed $Si_{1-x}Ge_x$ layer, wherein $x \geq y$.

4. At least one high-k device, comprising:
   a structure having a strained substrate formed thereover, the strained substrate comprising an uppermost strained-Si epi layer, a middle $Si_{1-x}Ge_x$ layer and a lower silicon oxide layer;
   at least one dielectric gate oxide portion over the strained substrate, the at least one dielectric gate oxide portion having a dielectric constant of greater than about 4.0; and
   a device over each of the at least one dielectric gate oxide portion to complete the at least one high-k device.

5. The device of claim 4, wherein the uppermost strained-Si epi layer has a thickness of from about 100 to 500 Å, the middle $Si_{1-x}Ge_x$ layer has a thickness of from about 700 to 1200 Å and the lower silicon oxide layer has a thickness of from about 800 to 2000 Å.

6. At least one high-k device, comprising:
   a structure having a strained substrate formed thereover, the strained substrate comprising an uppermost strained-Si epi layer over an upper relaxed $Si_{1-x}Ge_x$ layer over a graded $Si_{1-y}Ge_y$ layer over an epi layer over a lowermost relaxed $Si_{1-z}Ge_z$ layer, wherein $x \geq y \geq z$;
   at least one dielectric gate oxide portion over the strained substrate, the at least one dielectric gate oxide portion having a dielectric constant of greater than about 4.0; and
   a device over each of the at least one dielectric gate oxide portion to complete the at least one high-k device.

7. The device of claim 6, the uppermost strained-Si epi layer having a thickness of from about 100 to 500 Å; the upper relaxed $Si_{1-x}Ge_x$ layer having a thickness of from about 1000 to 50,000 Å; the graded $Si_{1-y}Ge_y$ layer having a thickness of from about 2000 to 50,000 Å; the epi layer having a thickness of from about 20 to 500 Å; and the lowermost relaxed $Si_{1-z}Ge_z$ layer having a thickness of from about 200 to 50,000 Å.

8. The device of claim 6, the uppermost strained-Si epi layer having a thickness of from about 150 to 300 Å; the upper relaxed $Si_{1-x}Ge_x$ layer having a thickness of from about 2000 to 40,000 Å; the graded $Si_{1-y}Ge_y$ layer having a thickness of from about 500 to 25,000 Å; the epi layer having a thickness of from about 50 to 200 Å; and the lowermost relaxed $Si_{1-z}Ge_z$ layer having a thickness of from about 500 to 25,000 Å.

9. The device of claim 6, where x is no less than y and less than about 0.50, where y is no less than z proximate the epi layer and increases to about x proximate the upper relaxed $Si_{1-x}Ge_x$ layer, and where z is greater than 0 and less than about 0.50.

10. The device of claim 6, wherein the at least one dielectric gate oxide portion being comprised of $HfO_2$ or $HfSiO_4$.

11. At least one high-k device, comprising:
    a structure having a strained substrate formed thereover, the strained substrate comprising an uppermost strained-Si epi layer, a relaxed $Si_{1-y}Ge_y$ layer under the uppermost strained-Si epi layer, a constant $Si_{1-y}Ge_y$ layer under the relaxed $Si_yGe_y$ layer, a silicon epi layer under the constant $Si_{1-y}Ge_y$ layer, and a constant $Si_{1-z}Ge_z$ layer under the silicon epi layer, wherein the uppermost relaxed-Si epi layer is comprised of $Si_{1-x}Ge_x$ wherein x is constant or graded;
    at least one dielectric gate oxide portion over the strained substrate, the at least one dielectric gate oxide portion having a dielectric constant of greater than about 4.0; and
    a device over each of the at least one dielectric gate oxide portion to complete the at least one high-k device.

12. The device of claim 11, wherein the relaxed $Si_{1-y}Ge_y$ layer has a thickness of from about 200 to 30,000 Å, the constant $Si_{1-y}Ge_y$ layer has a thickness of from about 200 to 20,000 Å, the silicon epi layer has a thickness of from about 20 to 500 Å, the constant $Si_{1-z}Ge_z$ layer has a thickness of from about 200 to 20,000 Å, and the uppermost strained-Si epi layer has a thickness of from about 20 to 500 Å.

13. The device of claim 11, wherein the relaxed $Si_{1-y}Ge_y$ layer has a thickness of from about 300 to 5000 Å, the constant $Si_{1-y}Ge_y$ layer has a thickness of from about 300 to 5000 Å, the silicon epi layer has a thickness of from about 50 to 300 Å, the constant $Si_{1-z}Ge_z$ layer has a thickness of from about 300 to 5000 Å, and the uppermost strained-Si epi layer has a thickness of from about 50 to 300 Å.

14. The device of claim 11, wherein the at least one dielectric gate oxide portion is comprised of $HfO_2$ or $HfSiO_4$.

15. At least one high-k device, comprising:
    a structure having a strained substrate formed thereover, the strained substrate comprising at least an uppermost strained-Si epi layer having a dislocation density of strained-Si epi of less than about $1E6/cm^2$;
    at least one dielectric gate oxide portion over the strained substrate, the at least one dielectric gate oxide portion having a dielectric constant of greater than about 4.0; and
    a device over each of the at least one dielectric gate oxide portion to complete the at least one high-k device.

16. The structure of claim 15, wherein the at least one dielectric gate oxide portion is comprised of $HfO_2$, $HfSiO_4$, N-doped hafnium, $HfSiO_X$, $ZrO_2$, $ZrSiO_X$ or N-doped zirconium silicate.

17. The device of claim 15, wherein the structure is a silicon substrate or a germanium substrate.

18. The device of claim 15, wherein the strained substrate is comprised of only the uppermost strained-Si epi layer.

19. At least one high-k device, comprising:
    a structure having a strained substrate formed thereover, the strained substrate comprising only an uppermost strained-Si epi layer having a thickness of from about 100 to 500 Å;

at least one dielectric gate oxide portion over the strained substrate, the at least one dielectric gate oxide portion having a dielectric constant of greater than about 4.0; and a device over each of the at least one dielectric gate oxide portion to complete the at least one high-k device.

20. The device of claim 19, the uppermost strained-Si epi layer having a thickness of from about 150 to 300 Å.

21. The device of claim 19, the uppermost strained-Si epi layer having a thickness of from about 200 to 300 Å.

* * * * *